(12) United States Patent
Salem

(10) Patent No.: US 6,300,677 B1
(45) Date of Patent: Oct. 9, 2001

(54) ELECTRONIC ASSEMBLY HAVING IMPROVED POWER SUPPLY BUS VOLTAGE INTEGRITY

(75) Inventor: Raoul B. Salem, Redwood City, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/387,280

(22) Filed: Aug. 31, 1999

(51) Int. Cl.[7] .................................................... H01L 23/52

(52) U.S. Cl. ............................................ 257/691; 257/684

(58) Field of Search ................................... 257/691, 725, 257/684, 686

(56) References Cited

U.S. PATENT DOCUMENTS 4,675,717 * 6/1987 Herrero et al. ........................ 357/71
6,005,812 * 12/1999 Mullarkey ........................ 365/189.09

OTHER PUBLICATIONS

Anonymous. "Logically controlled chip interconnection technique", IBM Tech. Discl. Bull. vol. 32, No. 3B, pp. 294–299, Aug. 1989.*

* cited by examiner

*Primary Examiner*—Caridad Everhart
(74) *Attorney, Agent, or Firm*—Sean P. Lewis

(57) ABSTRACT

An electronic assembly is described herein having a first semiconductor integrated circuit substrate with circuitry disposed thereon. This semiconductor integrated circuit substrate is coupled with a package through a first plurality of electrical connections. Sandwiched between portions of the semiconductor integrated circuit substrate and the package is an electronic assembly which is coupled to the semiconductor substrate circuitry and also the package through low resistance, low inductance connections. An electronic subassembly is described which includes a second semiconductor substrate having circuitry disposed thereon, the circuitry forming one or more of a capacitor, a charge pump, or a voltage regulator. Insulating material is disposed over the circuitry, and vias are formed therethrough. Metal bands are disposed to be continuous around the outside of the subassembly, thereby also forming a connection with the second semiconductor circuitry. The electronic subassembly metal bands then make connections with the circuitry of the semiconductor integrated circuit substrate and the package.

11 Claims, 3 Drawing Sheets

ELECTRONIC ASSEMBLY HAVING IMPROVED POWER SUPPLY BUS VOLTAGE INTEGRITY

BACKGROUND OF THE INVENTION

1. Field of the Invention

The present invention relates to semiconductor integrated circuits and capacitors. More particularly, the present invention relates to an apparatus formed by coupling a capacitor assembly to the underside of a semiconductor integrated circuit substrate, and then coupling the assembly formed thereby to a package.

2. The Background Art

In integrated circuit electronics, there often exists a need to use external capacitors to filter unwanted signals from conductive paths in order to ensure signal integrity at the receiving end of the conductor.

Capacitors are commonly used in filters which pass desirable frequencies and prevent the transmission of undesirable frequencies.

Filters with series capacitors are typically used to prevent low frequencies from being transmitted along a conductive path which is used to transmit desirable high frequency signals, and filters with shunt capacitors may be used to filter high frequencies from conductive paths used for supplying power to a region of circuitry. Typically, the capacitors used in these latter filters are integrated onto a semiconductor integrated circuit substrate if they have small values of capacitance, and are external to the semiconductor integrated circuit substrate if they have large values of capacitance.

FIGS. 1A and 1B are a side view and top view respectively of an integrated circuit substrate mounted on a package, with the resulting combination being mounted on a printed circuit board.

Referring to FIGS. 1A and 1B, integrated circuit 10 is shown including a multilayer package 12, an integrated circuit substrate 14, and a capacitor 16. Solder bumps 18 connect substrate 14 to package 12. Solder balls 20 connect package 12 to multilayer circuit board 22. Two conductive paths connect substrate 14 to capacitor 16, and two other conductive paths connect substrate 14 to capacitor 24.

In an integrated circuit, there are typically two types of connections made between a package and the integrated circuit substrate. First, there are input/output (I/O) connections, which typically connect the integrated circuit substrate to external environment signal sources and signal destinations. Second, there are core connections which provide connections between integrated circuit substrate circuitry and external components such as capacitors and resistors. Core connections have no external signal sources or signal destinations associated with them, and are typically centered on the integrated circuit substrate, completely surrounded by I/O connections.

Capacitors 16 and 24 are provided as examples of components designed into a system for the purpose of filtering unwanted signal frequencies from a conductive path. Although these capacitors function properly for their intended purpose, the conductive paths between the substrate and each of capacitors 16 and 24 have a characteristic high inductance which inhibits the effectiveness of the capacitors for high signal frequencies.

It is well known in the art that series inductances impede the passage of signals at higher frequencies, and series capacitances impede the passage of signals at lower frequencies. Shunt capacitors are capacitors provided between a conductive path and ground in order to shunt unwanted higher frequencies to ground. However, resistances and inductances in series with these shunt capacitors inhibits their effectiveness for this purpose.

The present invention provides a electronic assembly which provides capacitive filtering, while providing low resistance, low inductance connections between the integrated circuit substrate and the package.

SUMMARY OF THE INVENTION

An electronic assembly is described herein having a first semiconductor integrated circuit substrate with circuitry disposed thereon. This semiconductor integrated circuit substrate is coupled with a package through a first plurality of electrical connections. Sandwiched between portions of the semiconductor integrated circuit substrate and the package is an electronic assembly which is coupled to the semiconductor integrated circuit substrate circuitry, and also to the package through low resistance, low inductance connections.

An electronic subassembly is described which includes a second semiconductor substrate having circuitry disposed thereon, the circuitry forming one or more of a capacitor, a charge pump, or a voltage regulator. Insulating material is disposed over the circuitry, and vias are formed therethrough. Metal bands are disposed to be continuous around the outside of the subassembly, thereby also forming connections with the second semiconductor circuitry. The electronic subassembly metal bands then make low resistance, low inductance connections with the circuitry of the first semiconductor integrated circuit substrate and the package.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons who are familiar with this disclosure.

Figure 1A:
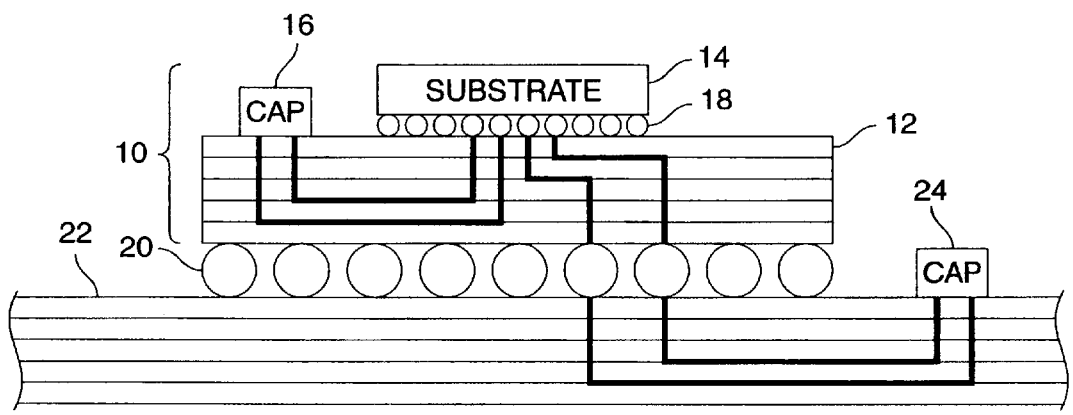
FIGS. 1A and 1B are a side view and top view respectively of an integrated circuit substrate mounted on a package, with the resulting combination being mounted on a printed circuit board.
Figure 1B:
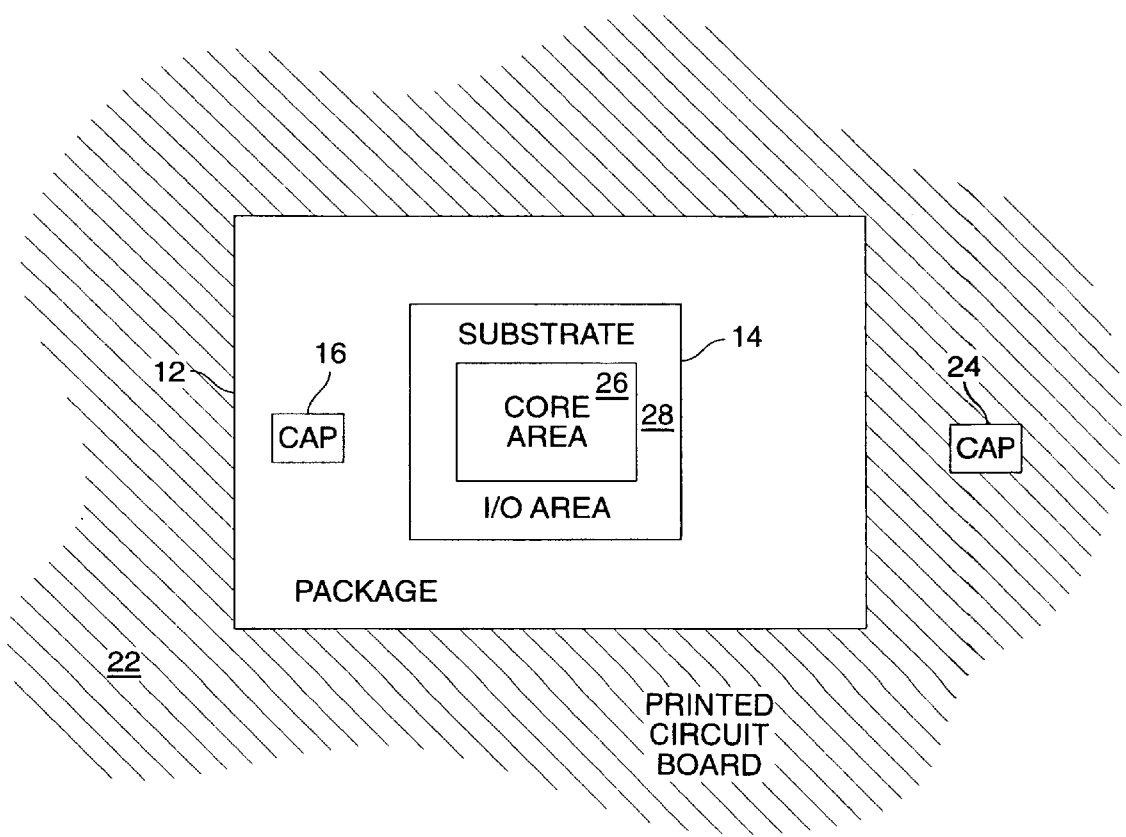
Figure 2:
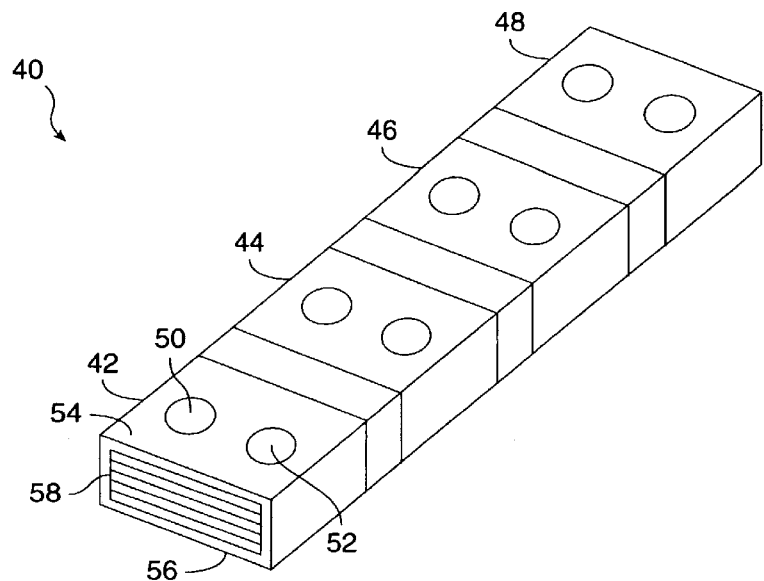
FIG. 2 is an isometric view of one embodiment of a present invention capacitor.
Figure 2:
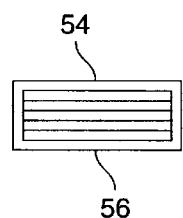

FIG. 2 is an isometric view of one embodiment of a present invention capacitor.

Referring to FIG. 2, capacitor assembly 40 includes conductive metal sections 42, 44, 46, and 48. It is necessary that top and bottom portions of a given metal section be connected with a very low resistance electrical connection. Each metal section has one or more connection locations on a top portion of the metal section and one or more solder bumps on a bottom portion of the metal section. For example, metal section 42 has connection locations 50 and 52 on top portion 54. A set of solder bumps (not shown) is present on bottom portion 56. The terms top and bottom when used to describe capacitor assembly 40 are used merely for illustrative purposes. Electrically, there is no difference between top and bottom, with respect to capacitor assembly 40. The intent here is to provide a very low resistance, low inductance connection between the top connection locations and bottom solder bumps of capacitor assembly 40, while also providing more effective capacitive filtering.

It is contemplated that each metal section 42, 44, 46, or 48 will represent one terminal of a two terminal capacitor. Although capacitor assembly 40 is shown herein having four metal sections which represent the terminals associated with two capacitors, it is contemplated that the present invention capacitor assembly may include as few capacitors as one, but as many as ten or more, depending on the requirements of the design implementing the present invention.

Figure 3:
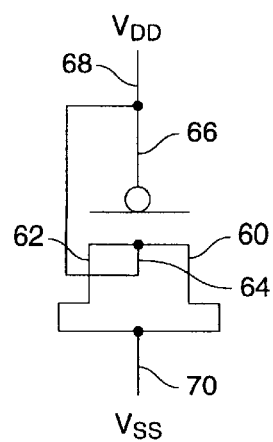
FIG. 3 is a schematic diagram of a prior art capacitor formed from a transistor assembly.

As shown, two capacitors are included in assembly 40, with each capacitor being formed from semiconductor structures which are deposited into the layered center section 58. One example of such a semiconductor structure is depicted schematically in FIG. 3 as a PMOS transistor connected in a capacitive configuration.

As shown, source 60 is connected to drain 62, and n-well 64 is connected to gate 66. The more positive connection to the capacitor is terminal 68, and the more negative connection is terminal 70.

Those of ordinary skill in the art readily recognize that many such capacitive structures may be connected in parallel to achieve greater capacitances than would result from a single device. It is also well known that devices of this type connected in series significantly reduce the resulting capacitance from that seen using one device.

Those of ordinary skill in the art having the benefit of this disclosure will readily recognize that capacitors may be formed on semiconductor substrates using other structures, while remaining within the scope and purpose of the present invention. For example, an NMOS transistor may be connected in a capacitor configuration and incorporated into an assembly utilizing the present invention.

It is contemplated that each capacitor within assembly 40 may either be identical structures, if the design requires that substantially similar capacitances be provided, or may instead be different, according to the requirements of the given design. It is also contemplated that any pair of terminals may be used as the more positive or more negative terminals. Thus, in the example of FIG. 2, metal sections 42 and 44 may represent the more positive and more negative terminals respectively of a first capacitor in assembly 40, and metal sections 46 and 48 may represent the more positive and more negative terminals respectively of a second capacitor in assembly 40. However, it is also contemplated that metal sections 42 and 46 may represent the terminals of one capacitor and metal sections 44 and 48 represent the terminals of the second capacitor. Finally, metal sections 42 and 48 may represent the terminals of a first capacitor, and sections 44 and 46 represent the terminals of a second capacitor.

It is also contemplated that a first set of metal sections may be tied to a more positive terminal of a capacitor and a second set of metal sections be tied to the more negative terminal of the same capacitor. In this example, metal sections 42 and 46 may be tied together and also to the more positive terminal of the capacitor, and metal sections 44 and 48 may be tied together and also to the more negative terminal of the capacitor.

It is further contemplated that assembly 40, in addition to having one or more capacitors disposed therein, may include such electronic devices as a charge pump or a voltage regulator. Those of ordinary skill in the art having the benefit of this disclosure will readily recognize that any combination of these devices may be included in assembly 40, as required by the particular implementation of the present invention.

Figure 4A:
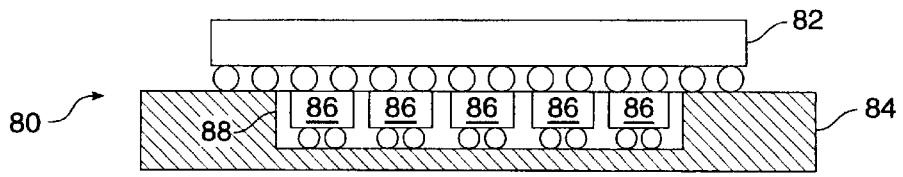
FIGS. 4A, 4B and 4C show a side view, top view and underside view respectively of a present invention assembly employing the present invention capacitor.
Figure 4B:
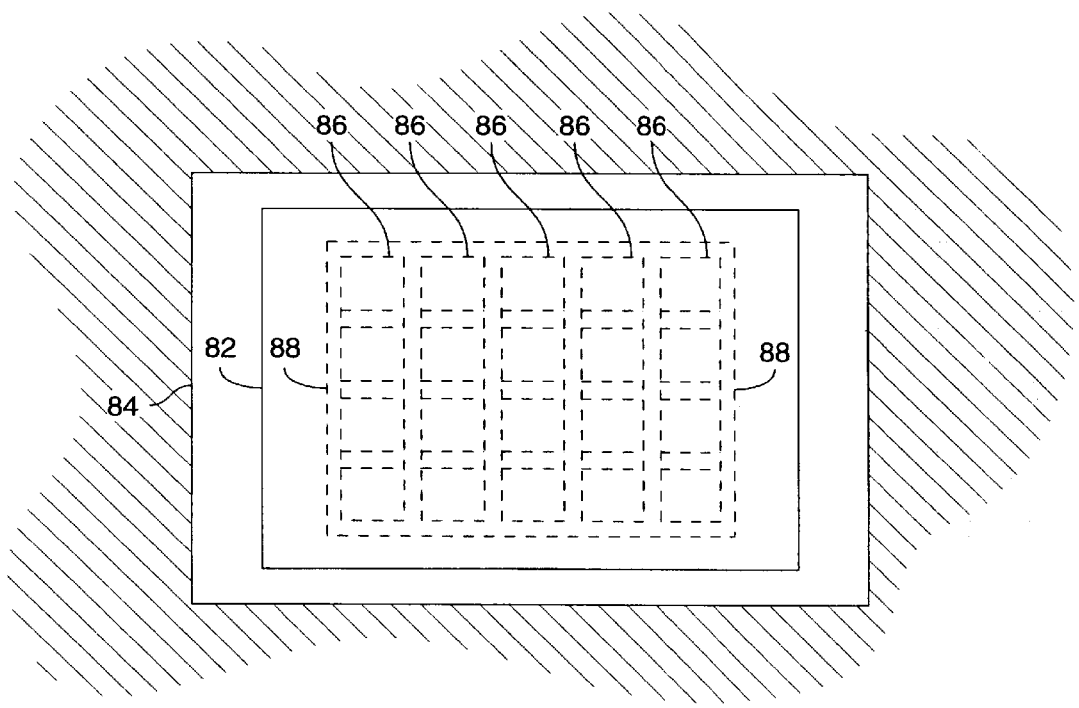
Figure 4C:
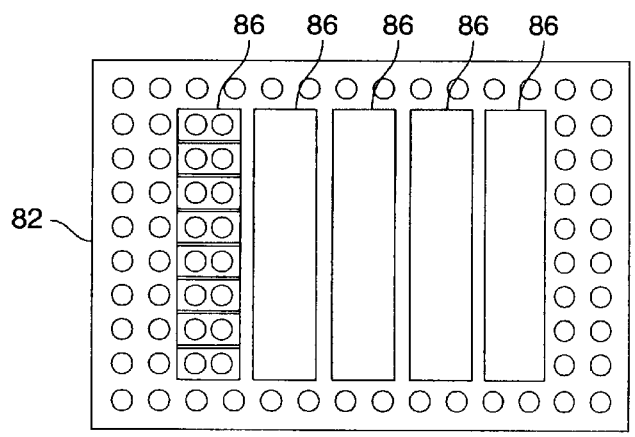

FIGS. 4A, 4B and 4C show a side view, top view and underside view respectively of a present invention assembly employing the present invention capacitor.

Referring to FIGS. 4A, 4B, and 4C together, assembly 80 includes integrated circuit 82, package 84 and capacitors 86. Assembly 80 is formed by coupling capacitors 86 to the underside of integrated circuit 82 using solder bumps, and then coupling the assembly formed thereby to package 84, using the solder bump connections on the underside of each of the capacitor assemblies and the as yet unused solder ball connections on the underside of integrated circuit 82. The completed step of coupling capacitors 86 to integrated circuit 82 is best seen in FIG. 4C where one capacitor is shown divided into eight metal sections, with each metal section having solder bumps which will be used when connecting the assembly to package 84.

Package 84 includes a connection well 88 which receives each of the capacitors 86 and provides connectivity to the capacitor solder bumps previously described.

Those of ordinary skill in the art having the benefit of this disclosure will readily understand how to couple capacitors 86 to semiconductor substrate 82 and then how to couple the resulting assembly with package 84.

Those of ordinary skill in the art having the benefit of this disclosure will also readily understand that alternate embodiments exist which are well within the scope of this disclosure.

For example, a different style of capacitor device could be used in place of assembly 40 of FIG. 2. One such capacitor is described in U.S. patent application having Ser. No. 09/320,341 entitled "Discrete Silicon Capacitor" and naming Bidyut Sen as inventor, the specification which is hereby incorporated herein by reference.

A second alternate embodiment used strictly to filter on-chip signals would include a capacitor having its positive and negative terminals on the same side of the capacitor, with the capacitor connected to the integrated circuit through solder bumps, with the capacitor possibly interfacing with package 84 through either a bonding material or a thermal dissipation material, or both.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An electronic assembly comprising:
   a semiconductor substrate having circuitry disposed thereon, said circuitry having a plurality of electrical connection locations;
   at least one insulating layer disposed over said circuitry and having vias formed therethrough to said plurality of electrical connection locations; and
   a plurality of metal bands formed so that each band is electrically isolated from each other band, each band is electrically connected with different ones of said plurality of electrical connection locations, and so that each metal band is continuous around the outside surface of the assembly formed from said substrate and said insulating layer, wherein the electrical path through the metal bands has a shorter length than through a package being coupled to the electronic assembly.

2. The electronic assembly of claim 1 wherein said circuitry is further defined as at least one capacitor.

3. The electronic assembly of claim 1 wherein said circuitry is further defined as at least one charge pump.

4. The electronic assembly of claim 1 wherein said circuitry is further defined as at least one voltage regulator.

5. An electronic assembly comprising:

a first semiconductor substrate having first circuitry disposed thereon, the substrate having a first plurality of electrical connection locations disposed thereon which connect to said circuitry;

an electronic subassembly comprising:

a second semiconductor substrate having second circuitry disposed thereon, said circuitry having a second plurality of electrical connection locations which connect to said second circuitry;

at least one insulating layer disposed over said second circuitry and having vias formed therethrough to said second plurality of electrical connection locations;

a plurality of metal bands formed so that each band is electrically isolated from each other band, each band is electrically connected with different ones of said second plurality of electrical connection locations, and so that each metal band is continuous around the outside surface of the assembly formed from said second substrate and said insulating layer, each metal band in said plurality being directly coupled to different ones of said first semiconductor substrate electrical connections;

a package having a third plurality of electrical connection locations associated therewith, said plurality of package connection locations being divided into a first set of connection locations and a second set of connection locations, the first set of package connection locations coupling with an equal number of first semiconductor substrate connection locations through said metal bands of said subassembly, the second set of package connection locations coupling with a plurality of first semiconductor substrate connection locations without being in contact with said subassembly, wherein the electrical path through the metal bands has a shorter length than through the package.

6. The electronic assembly of claim 5 wherein said second semiconductor circuitry is further defined as at least one capacitor.

7. The electronic assembly of claim 5 wherein said second semiconductor circuitry is further defined as at least one charge pump.

8. The electronic assembly of claim 5 wherein said second semiconductor circuitry is further defined as at least one voltage regulator.

9. The electronic assembly of claim 5 wherein said second semiconductor substrate is an n-type silicon substrate.

10. The electronic assembly of claim 5 wherein said second semiconductor substrate is a p-type silicon substrate.

11. The electronic assembly of claim 5 wherein said insulating layer comprises silicon dioxide.

* * * * *